United States Patent [19]
Canaris et al.

[11] Patent Number: 5,406,513
[45] Date of Patent: Apr. 11, 1995

[54] MECHANISM FOR PREVENTING RADIATION INDUCED LATCH-UP IN CMOS INTEGRATED CIRCUITS

[75] Inventors: John Canaris; Sterling Whitaker; Kelly Cameron, all of Albuquerque, N. Mex.

[73] Assignee: The University of New Mexico, Albuquerque, N. Mex.

[21] Appl. No.: 14,319

[22] Filed: Feb. 5, 1993

[51] Int. Cl.$^6$ ............................................. G11C 11/40
[52] U.S. Cl. .................................. 365/181; 365/190; 365/154; 365/156; 257/372; 257/373; 257/376; 257/369
[58] Field of Search ................ 365/53, 190, 156, 181, 365/154; 257/373, 376, 372, 369, 370

[56] References Cited

U.S. PATENT DOCUMENTS

| | | | |
|---|---|---|---|
| 4,689,653 | 8/1987 | Miyazaki | 257/373 |
| 4,782,467 | 11/1988 | Belt et al. | 365/154 |
| 4,785,200 | 11/1988 | Huntington | 307/279 |
| 4,805,148 | 2/1989 | Diehl-Nagle et al. | 365/154 |
| 4,820,942 | 4/1989 | Chan | 307/542 |
| 4,908,528 | 3/1990 | Huang | 307/443 |
| 4,937,473 | 6/1990 | Statz et al. | 307/443 |
| 4,940,905 | 7/1990 | Kobayashi et al. | 307/278 |
| 5,039,876 | 8/1991 | Hochwald et al. | 307/278 |
| 5,043,939 | 8/1991 | Slamowitz et al. | 365/154 |
| 5,111,429 | 5/1992 | Whitaker | 365/156 |
| 5,204,990 | 4/1993 | Blake et al. | 365/154 |

FOREIGN PATENT DOCUMENTS 58-218160 12/1983 Japan ...................... 257/372

OTHER PUBLICATIONS

S. Whitaker, J. Canaris and K. Liu, "SEU Hardened Memory Cells For A CCSDS Reed Solomon Encoder", IEEE Transactions on Nuclear Science, vol. 38, No. 6, pp. 1471–1477, Dec. 1991.

L. Rocket, "An SEU Hardened CMOS Data Latch Design", IEEE Transactions on Nuclear Science, vol. 35, No. 6, pp. 1682–1687, Dec. 1988.

S. E. Diehl, J. E. Vinson, B. D. Shafer and T. M. Mnich, "Considerations For Single Event Immune VLSI Logic", IEEE Transactions on Nuclear Science, vol. NS-30, No. 6, pp. 4501–4507, Dec. 1983.

J. F. Leavy, L. F. Hoffman, R. W. Shovan and M. T. Johnson, "Upset Due to a Single Particle Caused Propagated Transient in a Bulk CMOS Microprocessor", IEEE Transactions on Nuclear Science, vol. 38, No. 6, pp. 1493–1499, Dec. 1991.

(List continued on next page.)

Primary Examiner—Eugene R. LaRoche
Assistant Examiner—Huan Hoang
Attorney, Agent, or Firm—Haverstock, Medlen & Carroll

[57] ABSTRACT

A CMOS circuit formed in a semiconductor substrate having improved immunity to radiation induced latch-up and improved immunity to a single event upset. The circuit architecture of the present invention can be utilized with N-Well, P-Well and dual Well processes. For example, the circuit is described relative to an N-Well process. An N-Well is formed in a p-type substrate. A network of p-channel transistors are formed in the N-Well and a network of n-channel transistors are formed in the p-type substrate. A continuous P+guard ring is formed surrounding the n-channel transistors and between the n-channel transistors and the N-Well. Similarly, a continuous N+guard ring is formed surrounding the p-channel transistors and between the p-channel transistors and the p-type substrate. In the event of a radiation hit, the guard rings operate to reduce the parasitic impedance in the collector circuits of the parasitic bipolars forming a parasitic SCR and also act as additional collectors of radiation induced current. Single event upset immunity is improved by forming duplicate functions in an n-channel network and a p-channel network. N-channel control transistors are coupled to control p-channel load transistors and p-channel control transistors are coupled to control n-channel load transistors.

13 Claims, 9 Drawing Sheets

OTHER PUBLICATIONS

Y. Savaria, J. F. Hayes, N. C. Rumin and V. K. Agarwal, "A Theory for the Design of Soft-Error-Tolerant VLSI Circuits", IEEE Journal of Selected Areas in Communications, vol. SAC-4, No. 1, pp. 15-23, Jan. 1986.

Y. Savaria, N. C. Rumin, J. F. Hayes and V. K. Agarwal, "Soft-Error Filtering: A Solution to the Reliability Problem of Future VLSI Digital Circuits", Proceedings of the IEEE, vol. 74, No. 5, pp. 669-683, May 1988.

S. M. Kang and D. Chu, "CMOS Circuit Design for Prevention of Single Event Upset", Proceedings of 1986 International Conference on Computer Design, Port Chester, N.Y., 1986.

CROSS SECTION
FIG. 1
(PRIOR ART)

METAL 1

INTERCONNECT FROM METAL 1 TO METAL 2

METAL 2

INTERCONNECT FROM METAL 2 TO UNDERLYING STRUCTURES

POLYSILICON

SOURCE / DRAIN REGIONS

GUARD

WELL

MECHANISM FOR PREVENTING RADIATION INDUCED LATCH-UP IN CMOS INTEGRATED CIRCUITS

FIELD OF THE INVENTION

This invention relates to integrated circuits. More particularly, this invention relates to a layout for reducing the impact of radiation induced latch-up in CMOS integrated circuits.

BACKGROUND OF THE INVENTION

Figure 1:
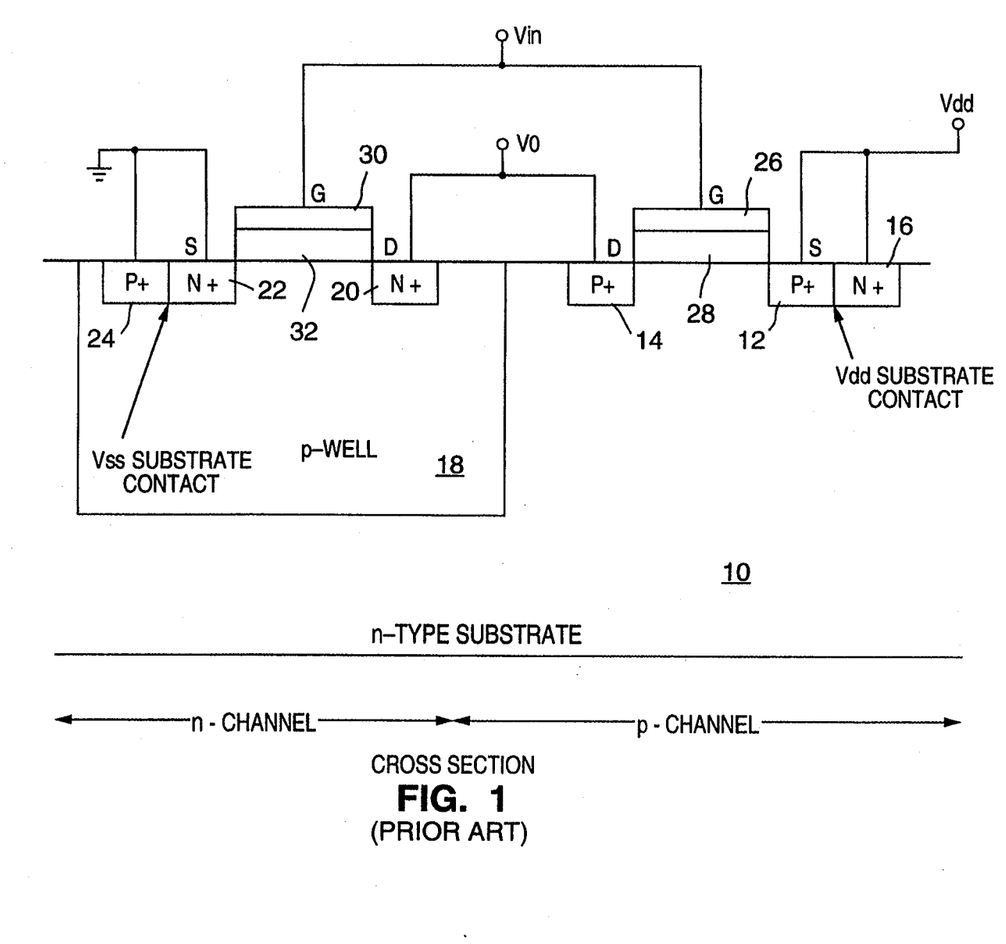
FIG. 1 shows a cross section of a prior art CMOS integrated circuit.

FIG. 1 shows a cross section of a typical CMOS integrated circuit. The circuit shown and described is a P-Well circuit. However, it will be apparent to those of ordinary skill in the art that this discussion also applies to N-Well circuits by simply interchanging N and P type structures.

An N-type semiconductor substrate 10 is provided for forming the integrated circuit thereon. P-channel devices are formed in the N-type substrate 10 by diffusing or implanting a source 12 and a drain 14. In the circuit of FIG. 1, the source 12 is coupled to a positive voltage supply Vdd. In typical CMOS circuits, a Vdd to substrate contact is formed of an N+ diffusion 16.

A P-well 18 is formed in the N type substrate. A drain 20 and a source 22 are formed within the N-well by diffusion or implantation. The source is coupled to Vss. A Vss to substrate contact is formed of a P+ diffusion 24 which is also coupled to ground. A P-channel gate 26 is formed over an insulation 28 in the channel region between the source 12 and the drain 14. Similarly, a gate 30 is formed on an insulating layer 32 between the drain 20 and the source 22 of the N-channel transistor in the P-well. This circuit is controlled by a voltage Vin applied to the two gates 26 and 30. The P-channel drain 14 is electrically coupled to the N-channel drain 20. The output of this circuit is a signal formed on the two drains $V_o$.

Figure 2A:
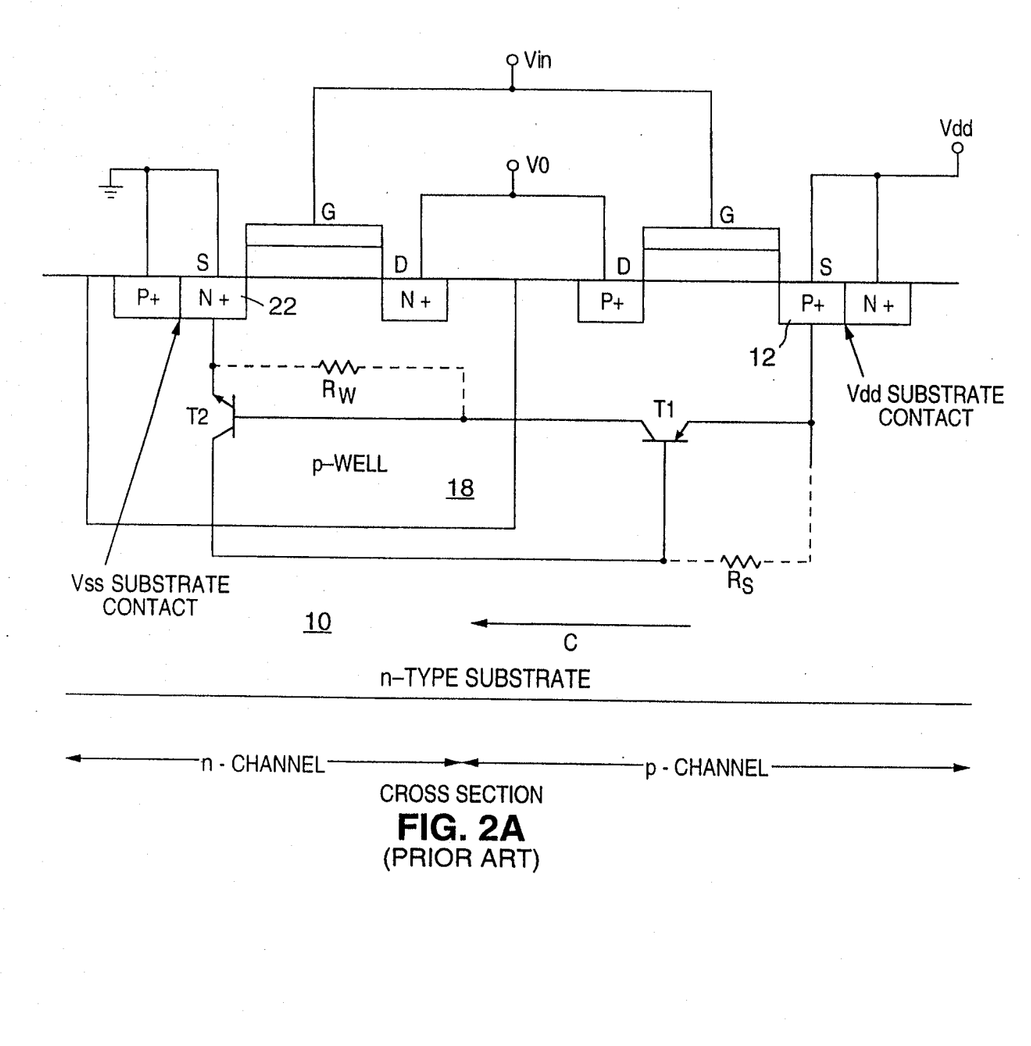
FIG. 2A shows a cross section of the circuit of FIG. 1 and the corresponding parasitic devices responsible for a latch-up condition.
Figure 2B:
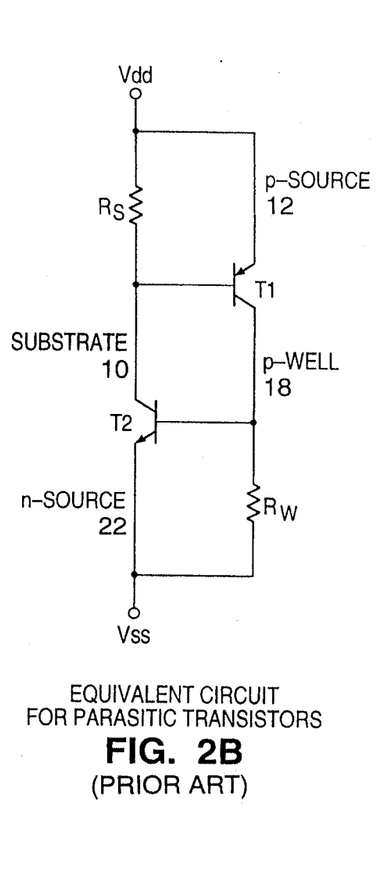
FIG. 2B shows the equivalent circuit of the parasitic devices of FIG. 2A which are responsible for a latch-up condition.

A radiation strike (e.g., an α particle or a heavy ion) in this circuit can induce latch-up of the circuit. Latch-up is a well understood and documented phenomenon resulting from parasitic bipolar transistors. This latch-up condition is a self sustaining high current condition which typically causes thermal runaway, which if let unchecked will permanently damage the circuit. FIG. 2 shows the cross section of FIG. 1 and the parasitic bipolar transistors T1 and T2 coupled as a Silicon Controlled Rectifier (SCR). The transistor T1 is a parasitic PNP transistor. The transistor T2 is a parasitic NPN transistor. The emitter of the transistor T1 is formed of the P+ source diffusion 12 of the P-channel transistor. The base of the transistor T1 and the collector of the transistor T2 are formed of the N type substrate 10. The collector of the transistor T1 and the base of the transistor T2 are formed of the P-Well diffusion 18. The emitter of the transistor T2 is formed of the N+ source diffusion 22 of the N-channel transistor. A parasitic impedance $R_s$ is formed in the substrate 10 between the base and the emitter of the parasitic PNP transistor T1. A parasitic impedance $R_w$ is formed in the P-Well 18 between the base and emitter of the parasitic NPN transistor T2. FIG. 2B shows the equivalent circuit for the parasitic transistors.

In the event of a radiation strike into the source or drain region of a transistor, the radiation injects current into the base of the PNP transistor T1 causing the transistor to conduct unwanted current and enter the saturation phase of operation. The unwanted current passing through the saturated transistor T1 is driven through the parasitic impedance $R_w$.

The impedance $R_w$ is coupled across the base-emitter junction of the transistor T2. If the value of the impedance $R_w$ multiplied by the unwanted current is sufficiently high, the voltage across the impedance $R_w$ can exceed the turn on potential for the transistor T2 causing it to conduct current. If the value of the impedance $R_s$ multiplied by the current through the transistor T2 is sufficient to form a voltage large enough to hold the transistor T1 in an active or saturated state latch-up has occurred. Thus, the transistors T1 and T2 now hold each other in an active and latched condition. Typically, normal operation of the circuit can only be recovered by removing the positive voltage supply Vdd.

A second common type of failure in CMOS integrated circuits is the single event upset (SEU) wherein a data bit or logic state in such a device can be corrupted if exposed to an ionized particle such as an α particle. Current induced by a particle hit flows from N type diffusion to a P type diffusion. Thus, for example, a "1" can be upset in an NMOS static RAM and a "0" can be upset in an PMOS static RAM cell. The design of static RAM cells is clearly described in U.S. Pat. No. 5,111,429 issued May 5, 1992, Sterling R. Whitaker one of the inventors of the present patent application. That patent entitled SINGLE EVENT UPSET HARDENING CMOS MEMORY CIRCUIT is incorporated in its entirety herein by reference.

SUMMARY OF THE INVENTION

A CMOS circuit formed in a semiconductor substrate having improved immunity to radiation induced latch-up and improved immunity to a single event upset. The circuit architecture of the present invention can be utilized with N-Well, P-Well and dual Well processes. For example, the circuit is described relative to an N-Well process. An N-Well is formed in a p-type substrate. A network of p-channel transistors are formed in the N-Well and a network of n-channel transistors are formed in the p-type substrate. A P+ guard bar electrically coupled to ground is formed between the n-channel transistors and the P-Well. Preferably, the P+ guard will be continuous and surround the n-channel transistors. Similarly, an N+ guard bar electrically coupled to Vdd is formed between the p-channel transistors and the p-type substrate. Preferably, the N+ guard will be continuous and surround the p-channel transistors. In the event of a radiation hit, the guard rings operate to reduce the parasitic impedance in the collector circuits of the parasitic bipolars forming a parasitic SCR and also act as additional collectors of radiation induced current.

Single event upset immunity is improved by forming duplicate functions in an n-channel network and a p-channel network. N-channel control transistors are coupled to control p-channel load transistors and p-channel control transistors are coupled to control n-channel load transistors.

DETAILED DESCRIPTION OF THE PREFERRED EMBODIMENT

Figure 3:
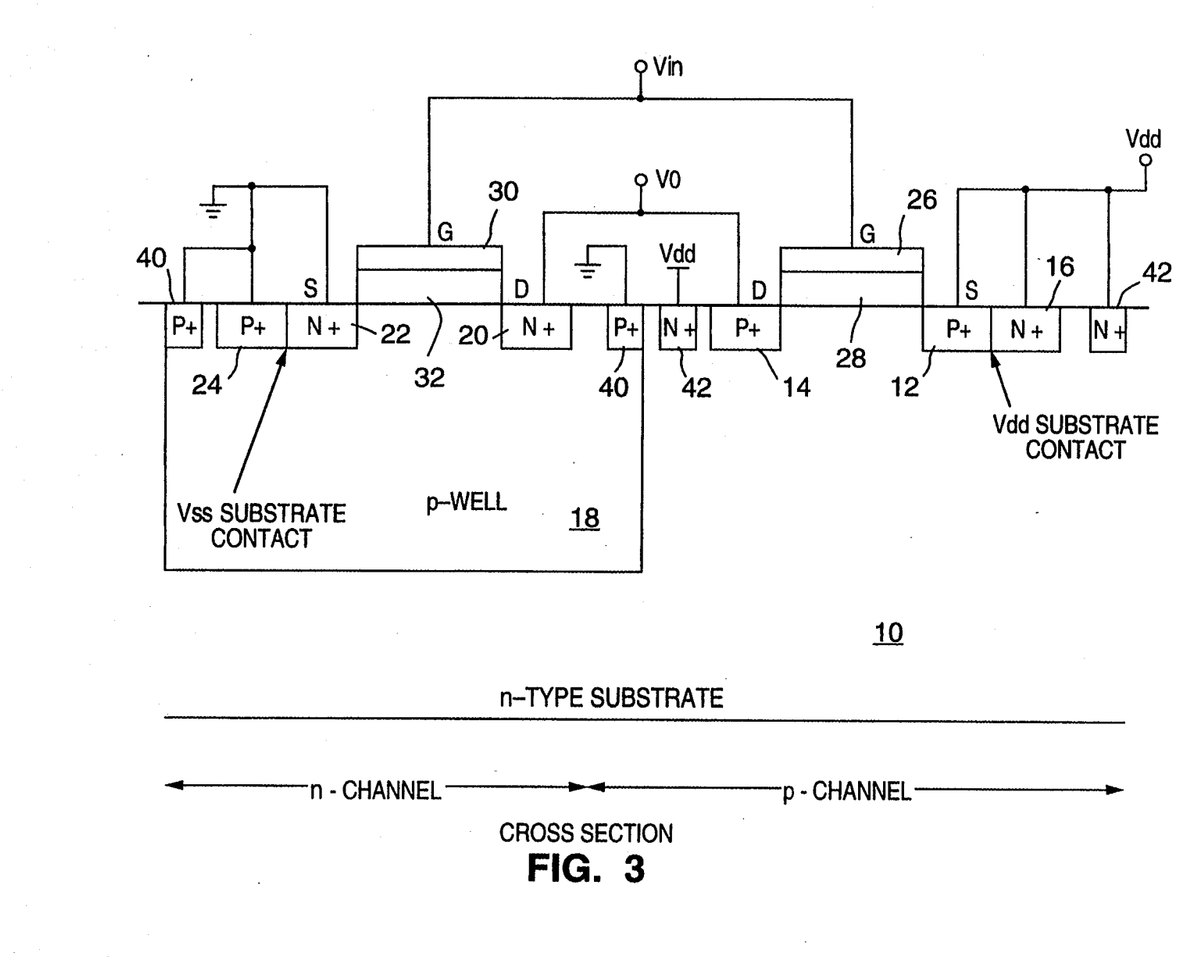
FIG. 3 shows a cross section of a CMOS integrated circuit according to the present invention.

FIG. 3 shows a cross section of an integrated circuit manufactured according to the preferred embodiment of the present invention. Where appropriate, corresponding elements in the preferred embodiment will be labeled with the same referenced numerals as the prior art shown in FIG. 1 and FIG. 2. Indeed all of the structures of FIG. 1 are found in FIG. 3. In addition, a P+guard 40 is tied to ground and surrounds the N-channel transistors. An N+guard 42 is tied to Vdd and surrounds the P-channel transistors.

It is important that the P+guard is positioned between each N-channel transistor and the N-type substrate and similarly that the N+guard is positioned between each P-channel device and the P-Well. Preferably, the entire P-Well is ringed with a continuous P+guard ring and all the non P-Well regions are ringed with a continuous N+guard ring.

It would be apparent to those of ordinary skill in the art that the complementary CMOS processes to the one disclosed here will be similarly handled. In particular, an N-Well CMOS process will incorporate an N+guard ring surrounding the circuitry formed within the N-Well and a P+guard ring surrounding those regions outside of the N-Well. In a double well CMOS technology the N-Well will be surrounded by an N+guard ring and the P-Well will be surrounded by a P+guard ring.

The guards 40 and 42 can be formed using the source-drain diffusion step in the processing of the integrated circuit. Accordingly, a radiation induced latch-up immune CMOS integrated circuit can be formed using any commercially available semiconductor process. Under certain circumstances it may be desirable to form a deeper junction for the guard rings 40 and 42. In those circumstances, an additional processing sequence must be added for the P+guard rings and for the N+guard rings.

Figure 4A:
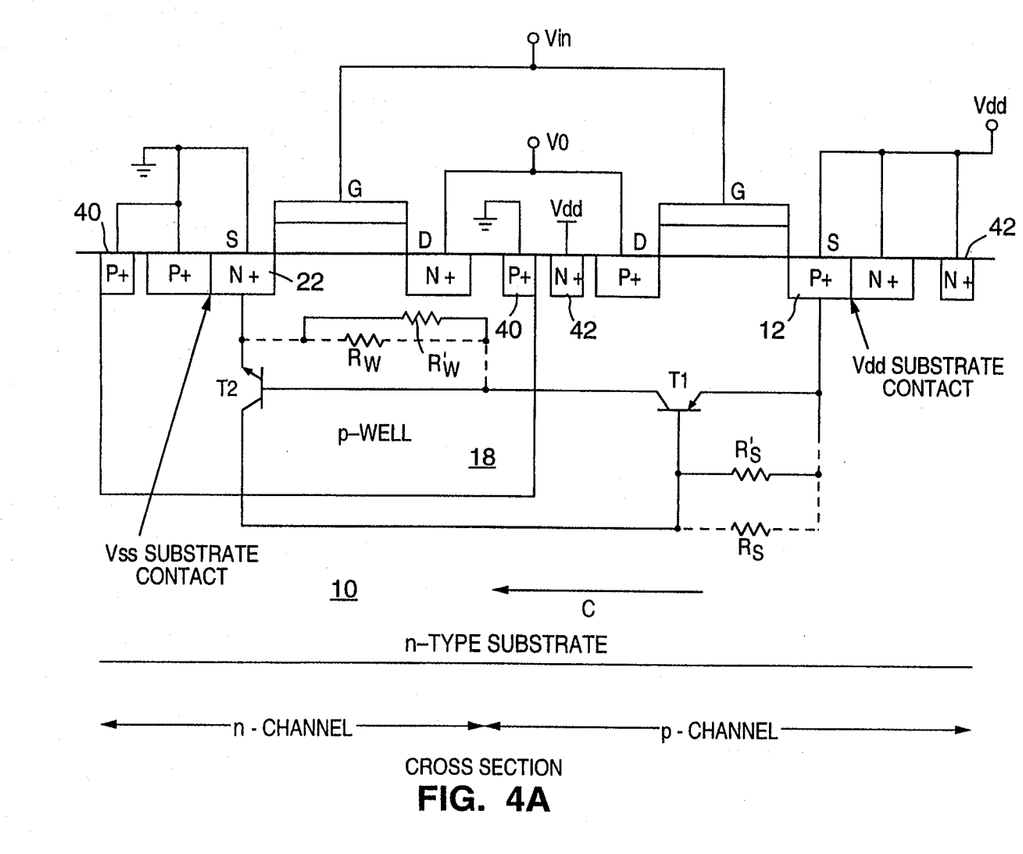
FIG. 4A shows a cross section of the circuit of FIG. 3 and the corresponding parasitic devices responsible for a latch-up condition.
Figure 4B:
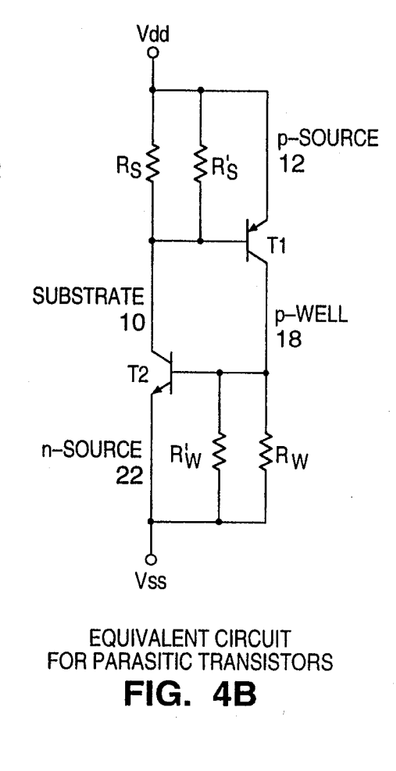
FIG. 4B shows the equivalent circuit of the parasitic devices of FIG. 4A which are responsible for a latch-up condition.

FIG. 4A shows the parasitic SCR construction as it relates to the cross section of FIG. 3. FIG. 4B shows the equivalent circuit for the parasitic transistor SCR. Note that the P+guard ring provides a low impedance resistance $R_w'$ in parallel with the resistance $R_w$. The N+guard ring provides a low impedance resistance $R_s'$ in parallel with the resistance $R_s$.

As shown in FIG. 4B, the guard rings prevent latch-up. The low impedance resistors $R_w'$ and $R_s'$ are formed in parallel to their principal impedances $R_w$ and $R_s$, respectively as shown in FIG. 4B. Because the parallel impedance of $R_w$ and $R_w'$ is substantially lower than the impedance of $R_w$, it takes a significantly higher radiation induced current to develop the turn on voltage for the transistor T2. Further, the resistor $R_w'$ acts as an additional collector for the current in the transistor T1. By similar analysis, the parallel resistances of the impedances $R_s$ and $R_s'$ is significantly lower than the impedance found only in the impedance of $R_s$. Accordingly, it will take significantly more radiation induced current through the transistor T2 to develop the turn on voltage for the transistor T1. Further, the impedance $R_s'$ acts as an additional collector to the radiation induced current in the transistor T2. Thus, such a radiation hit only produces a short current burst in the transistor T1 or T2 but does not disrupt the operation of the circuit by causing latch-up.

Figure 5:
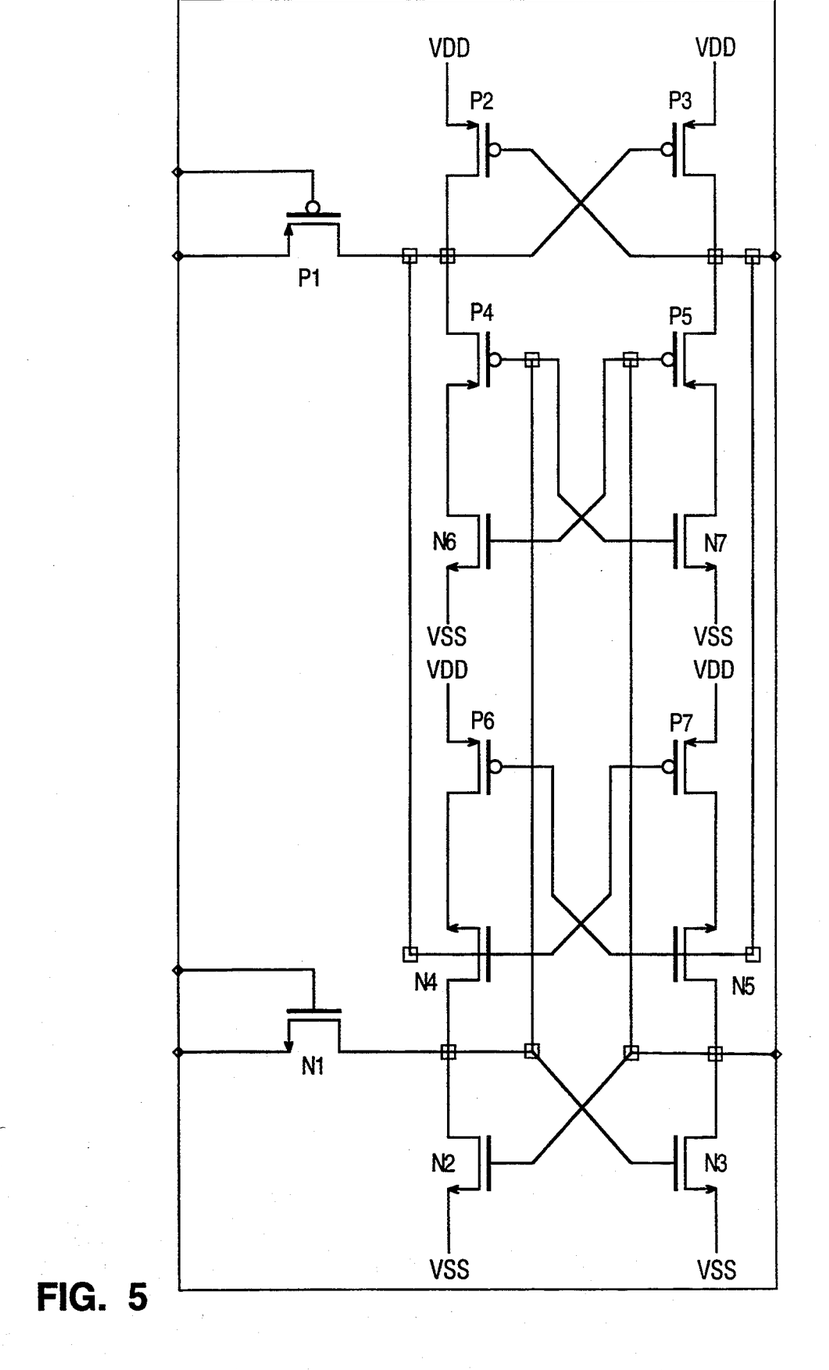
FIG. 5 shows a circuit schematic of a circuit which implements a single event upset immunity architecture according to the present invention.

FIG. 5 shows a circuit schematic for a static latch manufactured on a CMOS manufacturing process. There are seven N-channel devices and seven P-channel devices making up this latch circuit. An N-channel transistor N1 is configured as a pass transistor coupling a data input D to the circuit under control of a clock signal CK. The source of the pass transistor N1 is coupled to receive the D signal and the drain of the pass transistor N1 is coupled to the drain of an N-channel transistor N2, the source of an N-channel transistor N4 and to control the gates of an N-channel transistor N3, an N-channel transistor N7 and a P-channel transistor P4.

The drain of the transistor N3 is coupled to the Q output of the latch. The drain of transistor N3 is also coupled to the gate of the transistor N2 to the source of an N-channel transistor N5 and to control the gates of an N-channel transistor N6 and a P-channel transistor P5. The sources of the transistors N2 and N3 are coupled to the ground supply voltage Vss. The transistors N2 and N3 are cross-coupled for storing the output Q of the latch.

A p-channel transistor P1 is configured as a pass transistor for coupling the P-channel input data DP to the circuit. The source of the P-channel transistor P1 is coupled to receive the P-channel network data signal DP. The gate of the P-channel transistor P1 is controlled by a complimentary clock signal CKN. The drain of the transistor P1 is coupled to the drain of a P-channel transistor P2, to the gate of a P-channel transistor P3, to the source of a P-channel transistor P4, and to control the gates of the N-channel transistor N4 and a P-channel transistor P7.

The drain of the P-channel transistor P3 is coupled to the QP output of the circuit. The drain of the transistor P3 is also coupled to control the gate of the transistor P2 to the source of a transistor P5 and to control the gates of the N-channel transistor N5 and a P-channel transistor P6. The sources of the transistors P2 and P3 are coupled to the positive supply voltage Vdd. The transistor P2 and P3 are cross-coupled for storing the output QP.

The drain of the transistor N4 is coupled to the drain of the transistor P6, the source of the transistor P6 is coupled to the positive supply voltage Vdd. The drain of the transistor N5 is coupled to the drain of the transistor P6, the source of the transistor P6 is coupled to the positive supply Vdd. The drain of the transistor P4 is coupled to the drain of the transistor N6, the source of the transistor is coupled to the ground supply Vss. The drain of the transistor P5 is coupled to the drain of the transistor N7, the source of the transistor N7 is coupled to the ground supply Vss. As an example of the operation of the circuit of FIG. 5 during an SEU hit assume that Q=1 and QP =1. In steady state prior to the hit, N1 is off, N2 is on, N3 is off, N4 is off, N5 is on, N6 is on and N7 is off. Also, P1 is off, P2 is off, P3, is on, P4 is on, P5 is off, P6 is off and P7 is on.

In the event of a hit by a radiation particle in the N-channel network, current is induced by the hit to flow from the source or drain of the transistor N3 to the P-Well temporarily bringing the output Q to a "0". Because the gate of the transistor N2 is controlled by the output Q, it shuts off. The drain of the transistor N2 is electrically isolated from ground but floats thereby remaining at "0".

The P-channel transistor P5 is a load device to the storage transistor P3. The gate of the transistor P5 is controlled by the drain of the storage transistor N3, which is also the output Q. As the transistor turns on due to the SEU hit, the transistor P5 also turns on. However, the N-channel load N7 operated under control of the drain of the transistor N2 and accordingly the transistor N7 does not change state and remains off. Thus, the storage transistor P3 remains on and the output QP remains at "1". The loads N5 and P7 of the transistor N3 remain under control of the drains of the storage transistors P3 and P2, respectively. Thus, after the SEU induced current dissipates, the output Q returns to "1". The same analysis applies to an SEU impacting the output QP. Naturally, one of ordinary skill in the art would know how to interchange the various polarities and doping types.

Figure 6A:
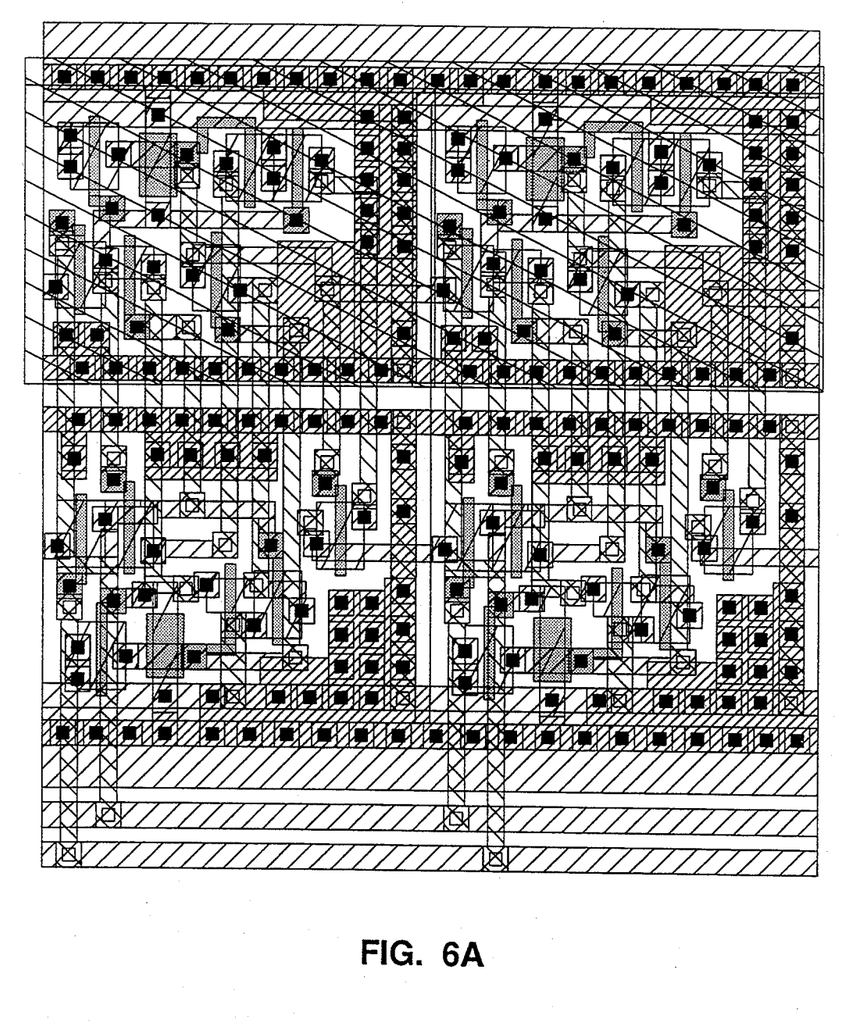
FIG. 6A shows a semiconductor mask layout for the circuit of FIG. 5.
Figure 6B:
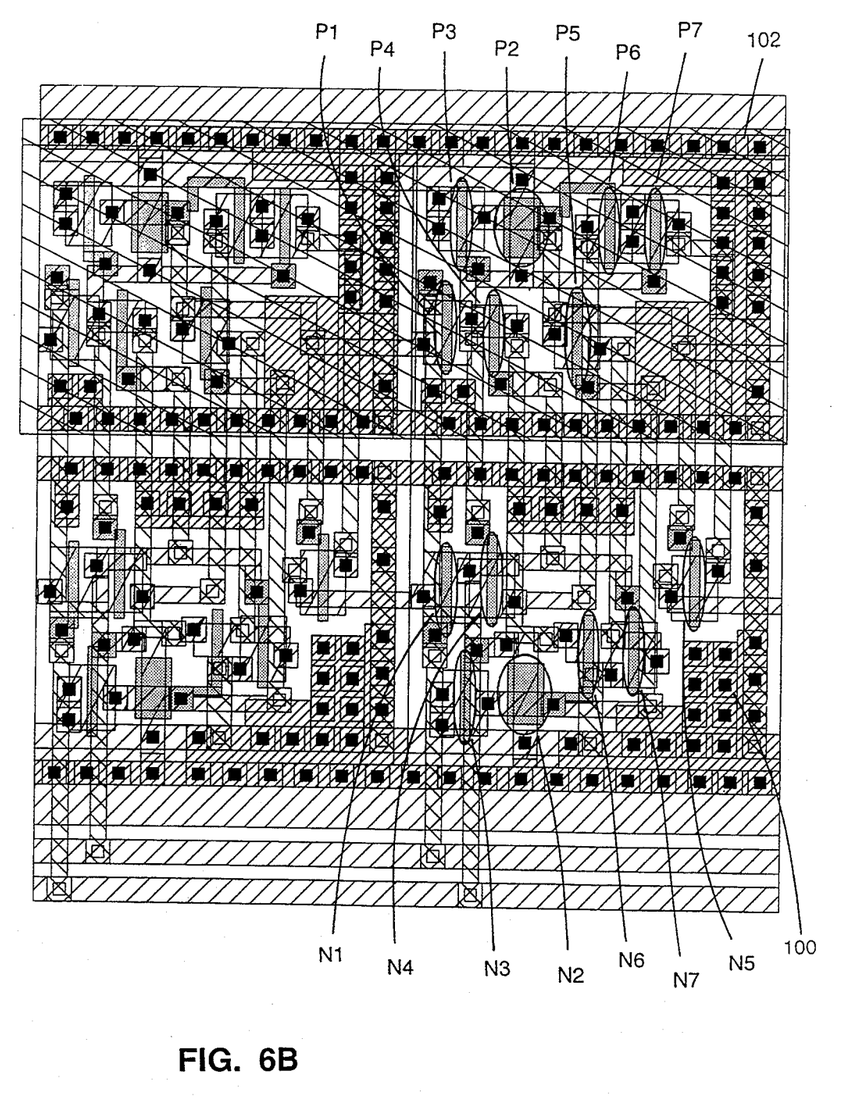
FIG. 6B shows the semiconductor mask layout for the circuit of FIG. 5 with the transistors and guard rings identified.

FIG. 6A shows a integrated circuit layout for the circuit of FIG. 5. FIG. 6B shows the transistors by corresponding reference numerals to FIG. 5. The P+guard ring 100 surrounds the n-channel devices. The N+guard ring 102 surrounds the p-channel devices.

Figure 7:
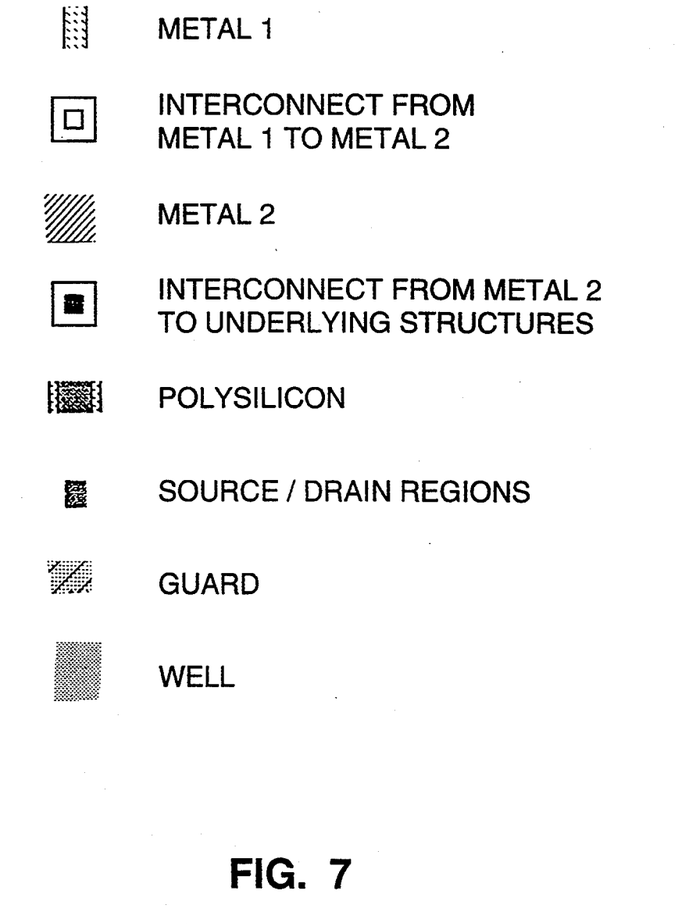
FIG. 7 shows the identification of the mask layers for FIGS. 6A and 6B.

FIG. 7 shows the identification of the mask layers for FIGS. 6A and 6B.

To test the efficacy of this invention, an experimental integrated circuit (test chip) was designed having five shift register designs. Three of the shift registers utilized memory cells designed to be tolerant of SEU's designs through three different logic/circuit design hardening techniques. The other two utilized non-hardened shift register designs to be used for comparisons. All of the structures were built using the SEL latch-up hardening techniques of the present invention. The test samples were processed through commercial 1 $\mu$m double metal CMOS process. The manufacturing process included none of the SEU or SEL variations suggested by others.

Tests to determine the SEU susceptibility of the specially designed memory cells were conducted to determine the threshold linear energy transfers (LETs) and cross-sections for SEU and latch-up due to heavy ions. The single event upset test facility utilized a Tandem Van De Graaff accelerator for providing various ions and energies. During the test, an ion beam was directed at a test board mounted inside a vacuum chamber. The facility included a computer-driven monitor and control program for the ion beam and test board setup.

Four of the test chips were placed on a wire-wrapped board, along with additional control logic, and mounted into the radiation test chamber. Three of the chips, with their die exposed, were placed in a heavy ion beam and individually irradiated. The fourth test chip was protected from the radiation and maintained as a control device. The output signals of the test chips being irradiated were compared in real time with the outputs of the control device. Counters were placed at the output of the board to record differences between the outputs of the chip being irradiated, and the outputs of the control chip. In this manner, upsets due to the heavy ion beam could be observed and quantified. The data sent through the shift register was comprised of an equal number of 1's and 0's. However, at any given time, different data patterns were sent through each register, to illuminate possible data dependent effects.

The current drawn by the chips was continuously monitored during the tests. Also, a current limit was placed on the voltage source such that if a latch-up condition occurred in any of the parts, the power would be removed from the entire test board. The test board and chips were running at 1 MHz with a 5 volt supply. The board drew a total of 10 mA of current while operating under these conditions. The test board also included circuitry that would emulate upsets. By using this circuitry, the counters could be calibrated, and the functionality of the entire set-up could be verified.

Experiments were conducted using Cl-31 at 206 MeV, Ni-58 at 265 MeV, I-270 at 320 MeV, and Au-197 at 350 MeV ions, beamed at various angles. The LET was steadily increased from 20 to 120 over the course of the experiment. The ion used for the beam was changed whenever the depth of the beam for the desired LET would be less than 20 $\mu$m. The non-hardened designs exhibited upsets under every condition. One of the hardened designs exhibited an SEU threshold of LET=35 while the threshold of the other two designs exceeded 120 MeV.cm$^2$/mg. No latch-up condition was observed in any of the 10 parts subjected to radiation, demonstrating an SEL threshold in excess of 120 MeV.cm$^2$/mg. A previous run of the same test chip without the latch-up hardening techniques of the present invention showed an SEL threshold of approximately 31 MeV.cm$^2$/mg.

Figure 8:
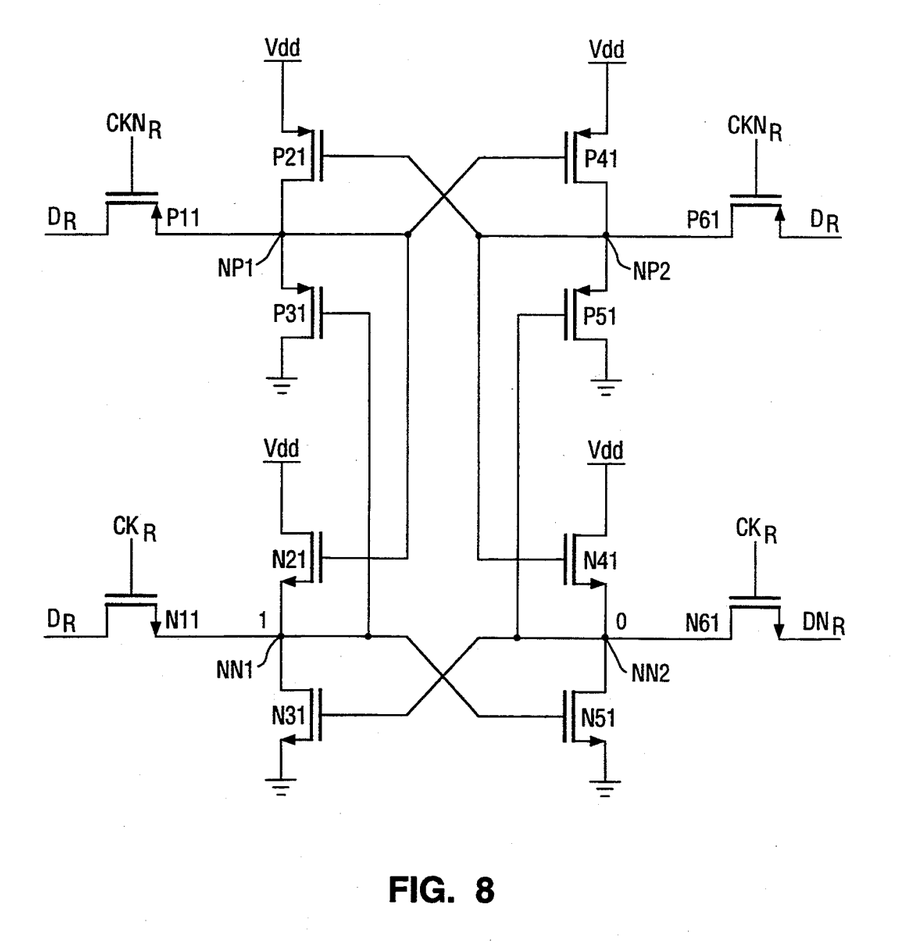
FIG. 8 shows a circuit schematic of an alternate circuit which implements a single event upset immunity architecture according to the present invention.

FIG. 8 shows a circuit schematic diagram of a RAM cell of the present invention. The RAM cell of FIG. 8 is hardened against a single event upset. Note that each transistor in the top half of the figure is a p-channel transistor and that each transistor in the bottom half of the figure is an n-channel transistor. This CMOS circuit includes a cross coupled pair of p-channel MOS transistors and a cross coupled pair of n-channel MOS transistors.

There is a power node Vdd and a ground terminal Vss. A first end of the channel of a p-channel MOS pas transistor P11 is coupled to a data line $D_R$ and a second end to a first p-channel data storage node, NP1. The gate of the pass transistor P11 is coupled to external control circuitry which is not shown and controlled by the inverse clock signal $CKN_R$.

The source of a p-channel storage MOS transistor P21 is coupled to Vdd. The drain of the transistor P21 is coupled to the second end of the channel of the pass transistor P11, the storage node NP1 and to the source of a p-channel MOS load transistor P31. The drain of the load transistor P31 is coupled to ground Vss.

The source of a p-channel storage MOS transistor P41 is coupled to Vdd. The drain of P41 is coupled to a second p-channel data storage node NP2 and to the source of a p-channel MOS load transistor P51. The drain of the load transistor P51 is coupled to ground Vss. A first end of a p-channel MOS pass transistor P61 is coupled to an inverse data line $DN_R$. The second end of the pass transistor P61 is coupled to a second p-channel storage node NP2. The gate of the pass transistor P61 is controlled by external circuitry which is not shown and is controlled by the inverse clock signal $CKN_R$.

The two p-channel storage transistors P21 and P41 are cross coupled. The gate of the transistor P21 is coupled to and controlled by the drain of the transistor P41. The gate of the transistor P41 is coupled to and controlled by the drain of the transistor P21.

A first end of the channel of an n-channel MOS pass transistor N11 is coupled to the data line $D_R$ and a second end to a first n-channel data storage node NN1. The gate of the pass transistor N11 is coupled to external control circuitry which is not shown and controlled by the clock signal $CK_R$. The drain of an n-channel transistor MOS load transistor N21 is coupled to Vdd. The source of the load transistor N21 is coupled to the second end of the channel of the pass transistor N11, the storage node NN1 and to the drain of an n-channel MOS transistor N31. The source of the transistor N31 is coupled to ground Vss.

The drain of an n-channel MOS load transistor N41 is coupled to Vdd. The source of the load transistor N41 is coupled to a second n-channel data storage node NN2 and to the drain of an n-channel MOS transistor N51. The source of the transistor N51 is coupled to ground Vss. A first end of an n-channel MOS pass transistor N61 is coupled to the inverse data line $DN_R$. The second end of the pass transistor N61 is coupled to a second n-channel storage node NN2. The gate of the pass transistor N61 is controlled by external circuitry which is now shown and is controlled by the clock signal $CK_R$.

The two n-channel storage transistors N31 and N51 are cross coupled. The gate of the transistor N31 is coupled to and controlled by the drain of the transistor N51. The gate of the transistor N51 is coupled to and controlled by the drain of the transistor N31.

The n-channel storage circuit and the p-channel storage circuit redundantly store a binary data bit. The two circuits are cross coupled in that the p-channel load transistors P31 and P51 are coupled to and controlled by the n-channel storage nodes NN1 and NN2 and the n-channel load transistors are coupled to and controlled by the p-channel storage nodes NP1 and NP2. In particular, the gate of the p-channel load transistor P31 is coupled to and controlled by the drain of the n-channel transistor N31. The gate of the p-channel load transistor P51 is coupled to and controlled by the drain of the n-channel transistor N51. The gate of the n-channel load transistor N21 is coupled to and controlled by the drain of the p=channel transistor P21. The gate of the n-channel load transistor N41 is coupled to and controlled by the drain of the p-channel transistor P41.

In order to perform the desired function, the n-channel load transistors N21 and N41 are designed to be weak in comparison to the n-channel transistors N31 and N51 and the load p-channel transistors P31 and P51 are designed to be weak in comparison the p-channel transistors P21 and P41. The remainder of the transistors are designed to meet normal design considerations for a RAM cell to allow the cell to be written, read and meet performance criterion.

The RAM cell of FIG. 8 prevents a single event upset. First, the stored bit is stored in two different places, i.e., the cross coupled n-channel storage transistors N31 and N51 and the cross coupled p-channel storage transistors P21 and P41. This redundancy provides and maintains a source of uncorrupted data for after an occurrence of a single event upset. Second, the feedback path between n-channel storage circuit and the p-channel storage circuit cause the lost data to recover after a particle strike.

Finally, use is made of the fact that the current that is induced by the particle strike of a single event upset causes current flow from an n-type diffusion to a p-type diffusion. Thus, if either of the n-channel storage nodes NN1 or NN2 are storing a "0" that data cannot be lost by the current induced by a particle hit from a single event upset. Similarly, if either of the p-channel storage node NP1 and NP2 are storing a "1" that data cannot be lost by a single event upset.

If the n-channel storage node NN1 is storing a "1" and is hit by a particle, a condition that would cause the loss of data in a non-hardened circuit, the node NN1 is driven to a "0" by the current flow and the n-channel transistor N51 is turned off leaving the second n-channel storage NN2 at "0". The p-channel load transistor P31 turns on, but because it is designed to be weak in comparison to the storage transistors it cannot overdrive the p-channel storage NP1. Thus, the n-channel load transistor N21, which is controlled by the p-channel storage node NP1, remains in an on condition thereby restoring the n-channel storage node NN1 to a "1". The same analysis applies to an SEU impacting a storage node controlled by a p-channel control transistor. One of ordinary skill in the art would know to interchange the various polarities and doping types.

The inventors have described the present invention in relation to two SEU techniques and specific circuit implementations thereof. Other techniques and circuits are presently known to those of ordinary skill in the art. The technique for improving latch-up immunity taught in this disclosure in combination with any other technique for improving SEU immunity is deemed within the spirit and scope of this invention.

Modifications and improvements which become apparent to a person of ordinary skill in the art after reading this patent disclosure are deemed within the spirit and scope of the present invention.

What is claimed is:

1. A CMOS circuit formed in a semiconductor substrate having a circuit-bearing-surface with a p-type region and an n-type region, the circuit includes a Vdd power supply and a Vss power supply, the circuit having improved immunity to radiation induced latch-up and comprising:
   a. an n-channel transistor formed in the p-type region of the substrate having a source coupled to Vss;
   b. a p-channel transistor formed in the n-type region of the substrate having a drain coupled to the n-channel transistor and a source coupled to Vdd;
   c. a single p+guard formed between the n-channel transistor and the n-type region wherein the p+guard is electrically coupled to Vss; and
   d. a single n+guard formed between the p-channel transistor and the p-type region wherein the n+guard is electrically coupled to Vdd, the circuit further comprising means for improving immunity to a single event upset comprising:

e. an n-channel network of devices for performing a function, the n-channel network having a plurality of n-channel control devices and a plurality of n-channel load devices;

f. a p-channel network of devices for performing the function, the p-channel network having a plurality of p-channel control devices and a plurality of p-channel load devices; and g. means for cross coupling the n-channel network and the p-channel network such that an n-channel control device controls a p-channel load device and a p-channel control device controls an n-channel load device.

2. The circuit according to claim 1 wherein the p+guard comprises a continuous region surrounding the p-type region and the n+guard comprises a continuous region surrounding the n-type region.

3. The circuit according to claim 1 wherein the p-type region is a well formed in an n-type substrate.

4. The circuit according to claim 1 wherein the n-type region is a well formed in an p-type substrate.

5. The circuit according to claim 1 wherein the p-type region and the n-type region are wells formed in the substrate.

6. The circuit according to claim 1 wherein the p-channel load transistors are designed to carry less current than the p-channel control transistors and wherein the n-channel load transistors are designed to carry less current than the n-channel control transistors.

7. The circuit according to claim 1 wherein the means for improving immunity to a single event upset further comprises:

a. a first network of devices for performing a function, the first network having a plurality of p-channel control devices and plurality of first loads, each first load having a serially connected n-channel load device and a p-channel load device such that the p-channel load device is coupled between the n-channel load device and one of the p-channel control devices and wherein the p-channel control devices and the first loads are appropriately interconnected for performing a predetermined logic function;

b. a second network of devices for performing a function, the first network having a plurality of n-channel control devices and plurality of second loads, each second load having a serially connected n-channel load device and a p-channel load device such that the n-channel load device is coupled between the p-channel load device and one of the n-channel control devices and wherein the n-channel control devices and the second loads are appropriately interconnected for performing the logic function; and c. means for cross coupling the first network and the second network such that an n-channel control device controls a p-channel load device in one of the first loads and an n-channel device in another of the first loads and a p-channel control device controls a p-channel load device in one of the second loads and an n-channel device in another of the second loads.

8. The circuit according to claim 7 wherein the n-channel load device and the p-channel load device in a load are either both conductive or both off.

9. A CMOS circuit formed in a semiconductor substrate having a first-doping-type, the circuit including a first and a second power supply, the circuit having improved immunity to radiation induced latch-up and comprising:

a. a well formed in the substrate of a second-doping-type, wherein the second-doping-type is opposite polarity of the first-doping-type;

b. a plurality of first-doping-type-channel transistors formed in the second-doping-type well each having an electrode electrically coupled to the first power supply;

c. a plurality of second-doping-type-channel transistors formed in the substrate outside of the well each having an electrode electrically coupled to the second power supply;

d. a single second-doping-type guard formed between the first-doping-type-channel transistors and the substrate, wherein the second-doping-type guard is electrically coupled to the first power supply; and e. a single first-doping-type guard formed between the second-doping-type-channel transistor and the well, wherein the first-doping type guard is electrically coupled to the second power supply, the circuit further comprising means for improving immunity to a single event upset comprising:

f. a first-doping-type-channel network of devices for performing a function, the first-doping-type-channel network having a plurality of first-doping-type-channel control devices and a plurality of first-doping-type-channel load devices;

g. a second-doping-type-channel network of devices for performing the function, the second-doping-type-channel network having a plurality of second-doping-type-channel control devices and a plurality of second-doping-type-channel load devices; and h. means for cross coupling the first-doping-type-channel network and the second-doping-type-channel network such that an first-doping-type-channel control device controls a second-doping-type-channel load device and a second-doping-type-channel control device controls and first-doping-type-channel load device.

10. The circuit according to claim 9 wherein the second-doping-type guard comprises a continuous region surrounding the well and the first-doping-type guard comprises a continuous region surrounding a portion of the substrate outside the well.

11. The circuit according to claim 9 wherein the second-doping-type-channel load transistors are designed to carry less current than the second-doping-type-channel control transistors and wherein the first-doping-type-channel load transistors are designed to carry less current than the first-doping-type-channel control transistors.

12. The circuit according to claim 11 wherein the means for improving immunity to a single event upset further comprises:

a. a first network of devices for performing a function, the first network having a plurality of second-doping-type-channel control devices and plurality of first loads, each first load having a serially connected first-doping-type-channel load device and a second-doping-type-channel load device such that the second-doping-type-channel load device is coupled between the first-doping-type-channel load device and one of the second-doping-type-channel control devices and wherein the second-doping-type-channel control devices and the first loads are appropriately interconnected for performing a predetermined logic function;

b. a second network of devices for performing a function, the second network having a plurality of first-doping-type-channel control devices and plurality of second loads, each second load having a serially connected first-doping-type-channel load device and a second-doping-type-channel load device such that the first-doping-type-channel load device is coupled between the second-doping-type-channel load device and one of the first-doping-type-channel control devices and wherein the first-doping-type-channel control devices and the second loads are appropriately interconnected for performing the logic function; and c. means for cross coupling the first network and the second network such that a first-doping-type-channel control device controls a first-doping-type-channel load device in one of the first loads and a second-doping-type-channel load device in another of the first loads and a second-doping-type-channel control device controls a first-doping-type-channel load device in one of the second loads and a second-doping-type-channel load device in another of the second loads.

13. The circuit according to claim 12 wherein the first-doping-type-channel load device and the second-doping-type-channel load device in a load are either both conductive or both off.

* * * * *

UNITED STATES PATENT AND TRADEMARK OFFICE
CERTIFICATE OF CORRECTION

PATENT No.: 5,406,513

DATED: April 11, 1995

INVENTOR: John Canaris et al.

It is certified that error appears in the above-identified patent and that said Letters Patent is hereby correct as shown below:

IN THE SPECIFICATION:
In Column 1, line 5, insert

--GOVERNMENT LICENSE RIGHTS
The U.S. Government has a paid-up license in this invention and the right in limited circumstances to require the patent owner to license others on reasonable terms as provided for by the terms of Federal Grant Numbers NAGW-1406 and NAGW-3293 awarded by NASA.-- as the first paragraph of the specification before "FIELD OF THE INVENTION."

Signed and Sealed this

Twenty-ninth Day of September, 1998

*Attest:*

BRUCE LEHMAN

*Attesting Officer*     *Commissioner of Patents and Trademarks*